(12) United States Patent
Anderson, III

(10) Patent No.: US 10,244,649 B2
(45) Date of Patent: Mar. 26, 2019

(54) ENCLOSURE FOR COMMUNICATIONS COMPONENTS

(71) Applicant: AMPTHINK, LLC, Garland, TX (US)

(72) Inventor: William Carl Anderson, III, Dallas, TX (US)

(73) Assignee: AmpThink, LLC, Garland, TX (US)

( * ) Notice: Subject to any disclaimer, the term of this patent is extended or adjusted under 35 U.S.C. 154(b) by 0 days.

(21) Appl. No.: 15/498,387

(22) Filed: Apr. 26, 2017

(65) Prior Publication Data

US 2017/0311467 A1 Oct. 26, 2017

Related U.S. Application Data

(60) Provisional application No. 62/327,960, filed on Apr. 26, 2016.

(51) Int. Cl.
| | |
|---|---|
| *H05K 7/02* | (2006.01) |
| *H02K 7/04* | (2006.01) |
| *H05K 5/06* | (2006.01) |
| *H05K 7/14* | (2006.01) |
| *H05K 5/00* | (2006.01) |
| *H05K 5/02* | (2006.01) |

(52) U.S. Cl.
CPC ........... *H05K 5/061* (2013.01); *H05K 5/0013* (2013.01); *H05K 5/0226* (2013.01); *H05K 7/1401* (2013.01)

(58) Field of Classification Search
CPC .... H05K 5/061; H05K 5/0013; H05K 5/0226; H05K 7/1401
USPC ............... 361/728–730, 752, 796, 800, 809
See application file for complete search history.

(56) References Cited

U.S. PATENT DOCUMENTS

| | | | | |
|---|---|---|---|---|
| 4,158,757 A | * | 6/1979 | Reichert | ............... H01H 9/04 174/564 |
| 5,531,345 A | * | 7/1996 | Nakamura | ............ H02G 3/088 220/3.8 |
| 7,245,497 B2 | * | 7/2007 | Klein | ................ H05K 5/0021 361/752 |
| 7,358,447 B2 | * | 4/2008 | Gabower | ............... B29C 51/10 174/378 |
| 7,563,992 B2 | * | 7/2009 | Lawlyes | ............... H05K 5/062 174/561 |
| 7,910,839 B2 | * | 3/2011 | Lynam | ................ H05K 9/0009 174/369 |
| 9,892,762 B1 | * | 2/2018 | Szeremeta | .......... G11B 33/142 |

* cited by examiner

*Primary Examiner* — Hung S. Bui
(74) *Attorney, Agent, or Firm* — AmpThink, LLC; James R. Banowsky

(57) ABSTRACT

In various implementations, an enclosure may be utilized to secure component(s) for a variety of applications, such as creating a communications network. For example, an enclosure may be utilized to secure electronic component(s). The enclosure may include shell(s) and a frame coupled to create a seal that inhibits the components in the enclosure from being exposed to fluids and/or particles. The shell(s) or portions thereof may not cause substantial signal loss.

20 Claims, 9 Drawing Sheets

ENCLOSURE FOR COMMUNICATIONS COMPONENTS

CROSS-REFERENCE TO RELATED APPLICATIONS

This application claims the benefit of U.S. Patent Application No. 62/327,960, entitled "Enclosure for Communications Components", filed on Apr. 26, 2016, which is hereby incorporated by reference for all purposes.

TECHNICAL FIELD

The present invention relates to an enclosure for communications components.

BACKGROUND

Housings are commonly used to hold and secure wireless components. The housings may be used inside buildings and/or outside buildings. However, when the housings are used outside (e.g., in stadiums, on roofs, or in parking lots), fluids (e.g., from rain, cleaning, or spills) and/or particulates (e.g., dust, debris, and/or spills) can contact and/or penetrate the housings and foul components within the housing. For example, fluids and/or particulates can contact the exterior of the housing and since the seals in the housings are often not water tight and/or fail, fluid may contact components inside the housing as well. Exposing the wireless components to fluids can affect performance and/or product life.

SUMMARY

In various implementations, enclosures are provided that include electronic components, such as communication components including active and/or passive antennae, sensors (e.g., temperature, vibration, noise, etc.), and/or any other appropriate electronic component. The enclosures may include one or more shells and one or more frames. Components may be statically and/or slidably coupled to the frame. An enclosure may protect components from the elements (e.g., rain, snow, etc.) since powered components may be damaged by exposure. For example, the shell(s) and the frame may be coupled to create a seal that inhibits exposing the components to fluid (e.g., from precipitation, leaks, and/or spills). The enclosures may be utilized in a variety of applications such as delivering wireless signals to a plurality of locations.

In various implementations, an enclosure that houses components, such as electronic components, may be provided. The enclosure may include shell(s) and a frame. The frame may provide structure, couple with other parts of the enclosure and/or couple components that reside in the enclosure. The frame may include a frame body with an inner wall and an outer wall. The frame may include a top section and a bottom section. The top section may include a first recess capable of receiving a first gasket and/or the bottom section may include a second recess capable of receiving a second gasket. One or more inner surfaces of the frame may be disposed between the first recess an edge of the top section and between the second recess an edge of the bottom section. One or more outer surfaces of the frame may be disposed between the first recess and the outer wall and between the second recess and the outer wall. The frame may include opening(s) disposed in at least one of the outer surfaces and through the top section and the bottom section. The opening(s) may receive a fastener to couple the frame to an enclosure capable of housing electrical components. The enclosure may include a first gasket that may be disposed partially in the first recess of the frame body and/or a second gasket that may be disposed partially in the second recess of the frame body. The enclosure may include a first and second shell, in some implementations. The first shell may include a first body that includes a first cavity, a first flange extending from the first body of the first shell, and/or a first rim coupled to the first flange, The second shell may include a second body that includes a second cavity, a second flange extending from the second body of the second shell, and/or a second rim coupled to the first flange. The second flange may receive the frame (e.g., the frame may be disposed in and/or on the second flange). The first rim of the first shell may overlap the second rim of the second shell when the first shell and the second shell are coupled, in some implementations. The enclosure may be at least partially sealed by first contact between the first gasket the frame and between the first gasket and the first flange of the first shell and/or by second contact between the second gasket and the frame and between the second gasket and the second flange of the second shell.

Implementations may include one or more of the following features. The first shell and the second shell may be portions of a one-piece shell that are joined by a hinge. The first shell and the second shell may include one or more aligned shell openings to couple the first shell and the second shell. The aligned shell opening(s) may be disposed such that at least one fastener may be disposed through at least one shell aligned opening and at least one opening in the frame. The first gasket and/or the second gasket may be compressible. The first gasket and the second gasket may be at least partially compressed by at least one of the fasteners disposed in at least one of the aligned shell openings, when the enclosure is assembled. In some implementations, the enclosure may include component bracket(s) capable of coupling with one or more electronic components and/or the frame. The frame body may include slot(s) disposed between the top section and the bottom section of the frame. The slot(s) may receive a component bracket. Slot(s) may be disposed along at least part of the first side and/or second side of the body. In some implementations, a component bracket may include a first protrusion that is capable of being disposed in at least one of the slots disposed along a part of the first side of the body and/or a second protrusion that is capable of being disposed in at least one of the slots disposed along a part of the second side of the body to couple the component bracket to the body. The enclosure may include mount(s) that couple the enclosure to a location. A first end of a mount may couple to the first shell and/or the second shell, and a second end of a mount may couple to the location (e.g., the location to which the enclosure is being coupled). In some implementations, the frame may include one or more chamfered corners. A chamfered corner may include at least two corners and an angled section disposed between at least two of the corners. A corner may be a bend in the outer wall. A portion of the top section may be removed such that the bend disposes a free edge of a first edge of the top section proximate to a free edge of the second edge of the top section in the corner. A portion of the bottom section may be removed such that the bend disposes a free edge of a first edge of the bottom section proximate to a free edge of the second edge of the bottom section in the corner. The enclosure may be water resistant upon assembly. The enclosure may include a sealing clamp. The sealing clamp may allow cabling to extend from exterior to the enclosure and into the first cavity of the first shell and the second cavity of the second shell.

In various implementations, the frame of the enclosure may include a body. The body of the frame may include a first side, a second opposing side, an outer wall, a top section and a bottom section. The top section may include a first recess to receive a first gasket. The bottom section may include a second recess to receive a second gasket. In some implementations, the top section and/or the bottom section may include one or more recesses to guide the gasket into an appropriate position (e.g., a gasket may be disposed between protrusion, a gasket may be disposed outside or inside a series of protrusions, etc.). The body of the frame may include inner and outer surface(s). The inner surface(s) may be disposed between the first recess an edge of the top section and between the second recess an edge of the bottom section and/or the outer surface(s) may be disposed between the first recess and the outer wall and between the second recess and the outer wall. The body of the frame may include opening(s) disposed in at least one of the outer surfaces. The opening(s) may be disposed through the top section and the bottom section. The opening(s) may receive a fastener to couple the frame to at least part of an enclosure capable of housing electrical components. The body of the frame may include one or more slots disposed between the top section and the bottom section. The slot(s) may receive component bracket(s). At least one slot may be disposed along at least part of the first side and/or the second side of the body. The component bracket(s) may be capable of coupling with one or more electronic components. The component bracket(s) may include one or more first protrusions to be disposed in at least one of the slots disposed along a part of the first side of the body and/or one or more second protrusions to be disposed in at least one of the slots disposed along a part of the second side of the body to couple the component bracket to the body.

Implementations may include one or more of the following features. The frame may include a first gasket partially disposed in the first recess of the body and/or a second gasket partially disposed in the second recess of the body. The frame may create a seal between a first portion of a housing of the enclosure and a second portion of a housing of the enclosure by allowing at least a part of the first portion of the housing to contact the first gasket and/or by allowing at least a part of the second portion of the housing to contact the second gasket. The body of the frame may include a third side and an opposing fourth side. Additional component bracket(s) (e.g., capable of coupling with electronic components) may be coupled to the frame via one or more third protrusions and/or fourth protrusions. At least one of the third protrusions may be disposed in at least one of the slots disposed along a part of the third side of the body and at least one of the fourth protrusions may be disposed in at least one of the slots disposed along a part of the fourth side of the body to couple the additional component bracket(s) to the body. In some implementations, at least one of the component brackets may be slidably coupled to the body such that a position of the at least one component bracket is alterable. The body of the frame may include one or more flanges extending from the body of the frame. The flange may extend beyond a housing of an enclosure, in which the frame is disposed, to allow cabling to extend from a cavity of frame to beyond the enclosure.

In various implementations, a body of a frame may include a first side, an opposing second side, an outer wall disposed proximate an outer surface of the frame, a top section, and a bottom section. The top section may include one or more first recess(es) capable of receiving first gasket(s) and/or the bottom section may include one or more second recess(es) capable of receiving second gasket(s). The frame may include one or more chamfered corners. A chamfered corner may include at least two corners and an angled section disposed between at least two of the corners. A corner may be a bend in the outer wall. A portion of the top section may be removed such that the bend disposes a free edge of a first edge of the top section proximate to a free edge of the second edge of the top section in at least one of the corners of the chamfered corner and/or a portion of the bottom section may be removed such that the bend disposes a free edge of a first edge of the bottom section proximate to a free edge of the second edge of the bottom section in at least one of the corners of the chamfered corner. The frame may include one or more first gaskets partially disposed in one or more of the first recesses of the body and/or one or more second gaskets partially disposed in the second recess of the body. The frame may be positionable in an enclosure (e.g., capable of housing one or more electronic components). The frame may create a seal between a first portion of a housing of the enclosure and a second portion of a housing of the enclosure by allowing at least a part of the first portion of the housing to contact the first gasket and/or by allowing at least a part of the second portion of the housing to contact the second gasket.

Implementations may include one or more of the following feature. The body of the frame may be a one-piece body, in some implementations. The frame may include inner surface(s) and/or opposing outer surface(s). The inner surface(s) may be disposed between the first recess an edge of the top section and between the second recess an edge of the bottom section and/or the outer surface(s) may be disposed between the first recess and the outer wall and between the second recess and the outer wall. The body may include one or more openings disposed in the outer surface(s) and through the top section and/or the bottom section. An opening is may receiving a fastener to couple the frame to an enclosure (e.g., capable of housing electrical components). The body may include slot(s) disposed between the top section and the bottom section. The slot(s) may receive one or more component brackets. At least one slot may be disposed along at least part of the first side of the body and/or at least one slot may be disposed along at least part of a second side of the body. The frame may include component bracket(s) capable of coupling with one or more electronic components. A component bracket may include one or more first protrusion(s) and one or more second protrusion(s). First protrusion(s) may be disposed in at least one of the slots disposed along a part of the first side of the body and/or second protrusion(s) may be disposed in at least one of the slots disposed along a part of the second side of the body to slidably couple the component bracket to the body. The frame may include one or more flanges extending from the body of the frame. A flange may extend beyond a housing of an enclosure, in which the frame is disposed, to allow cabling to extend from a cavity of frame to beyond the enclosure. The first recess and/or the second recess may extend along at least a portion of the length of the perimeter of the body of the frame, in some implementations.

The details of one or more implementations are set forth in the accompanying drawings and the description below. Other features, objects, and advantages of the implementations will be apparent from the description and drawings.

BRIEF DESCRIPTION OF THE DRAWINGS

For a more complete understanding of this disclosure and its features, reference is now made to the following description, taken in conjunction with the accompanying drawings, in which.

Like references in the various drawings indicate like elements.

DETAILED DESCRIPTION

Figure 1:
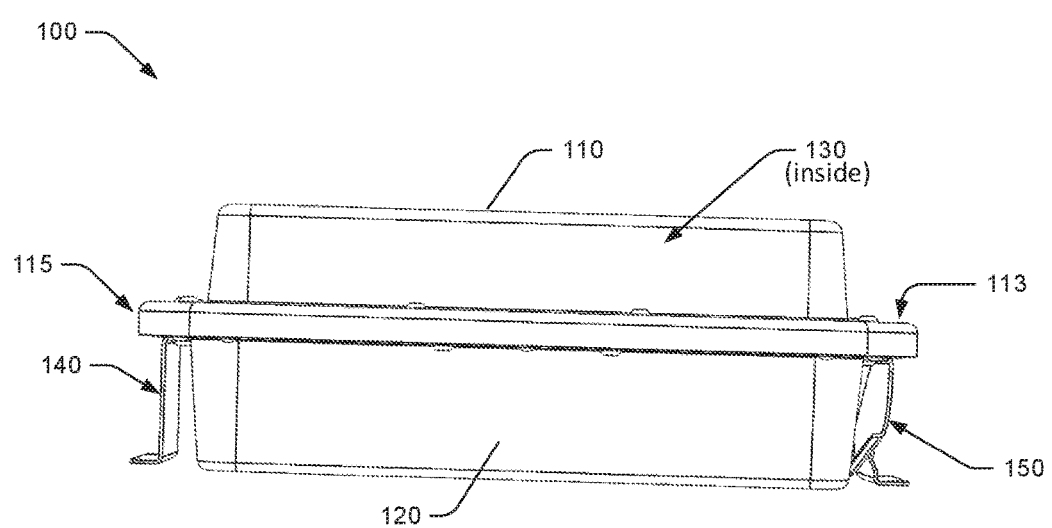
FIG. 1 illustrates an implementation of an example enclosure.

Enclosures may be used in a variety of applications, such as the deployment of, for example, large scale Wi-Fi systems. The enclosures may house various components, such as electrical components and/or other types of components. For example, electrical components may include communication components (e.g., RF and/or Wireless transmission equipment such as Wi-Fi access points, radio frequency base stations, remote units, zone components, optical network terminals, and/or other active RF related electronics; wired communication equipment; fiber optic communication equipment, such as a fiber optic communication access point, fiber optic converter, and/or connectors; converters; active antennae; passive antennae; and/or other appropriate types of communication equipment), sensors (e.g., temperature, vibration, noise, moisture, etc.), power supplies, and/or any other appropriate electronic component. The components can be positioned and/or secured in the enclosure. Since the enclosures are designed for use in communication networks, at least a portion of the enclosure must not inhibit communication with other devices. For example, the enclosure may not substantially reduce the ability of the wireless components to communicate with and/or receive communications from other devices. In some implementations, the enclosure may be a housing that is visually appealing and/or less visually obtrusive (e.g., to increase user satisfaction and/or to inhibit tampering).

The enclosure may be used inside structures (e.g., buildings, covered stadiums, uncovered stadiums, pavilions, etc.), and/or outside (e.g., in parks, on uncovered patios, etc.). For example, the enclosure may be coupled to walls, seats (e.g., under seats), overhead (e.g., coupled to exposed trusses, coupled to the ceiling, etc.), hand railing, etc. The enclosure may include mounts to couple the enclosure to a location inside structures and/or outside.

In some implementations, the size and/or shape of an enclosure may be selected to allow the enclosure to be received in, coupled to, and/or disposed at least partially in an existing opening in a location. For example, in some locations, an opening may exist in a wall and/or ceiling for existing communication equipment (e.g., phone line, cable connections, etc.). The enclosure may be sized and/or shaped to be at least partially disposed in the opening to allow replacement of existing communication equipment and/or replacement of the existing housing. Thus, a new opening may not need to be created to allow upgrades, which may reduce costs, facilitate installation, and/or allow reuse of one or more of the existing equipment.

In some implementations, the size and/or shape of the enclosure may be selected based on placement of the enclosure. For example, when the enclosure is used under seating, the size and/or shape may be selected such that the function of the seat is not inhibited (e.g., movement of the seat, comfort of the seat, etc.).

The enclosure may include a seal. The seal may inhibit fluids and particulates outside the enclosure from entering the enclosure via a sealed region (e.g., an area inside a seal). The enclosure may be accidentally or intentionally exposed to fluids (e.g., water, soda, alcohol, juice, vomit, etc.) during use. The seal may inhibit fluids and/or particles (e.g., dust, debris, etc.) from entering the interior of the enclosure. Since exposure to fluids may reduce performance and/or foul (e.g., cause wear and/or damage) components positioned in the enclosure, inhibiting fluids from entering the enclosure may reduce costs associated with repairing and replacing the components (e.g., due to fluid exposure) and/or may improve user satisfaction (e.g., by reducing performance problems based on fluid exposure).

In some implementations, the seal may be opened and closed to allow access to the components positioned in the enclosure (e.g., for maintenance, repair, replacement, etc.). The seal may allow repeat opening and closing to facilitate maintenance, inspections, and/or replacement of the enclosure or portions thereof. In some implementations, the seal may be replaceable.

The enclosure may include a frame, first shell, and a second shell. The first shell and/or the second shell may have one or more cavities. When the shells are coupled together at least one cavity may be created between the inner surfaces of the first and second shells. Components, such as electronic components (e.g., communication components, sensors, power supplies, etc.), may be disposed in one or more of the cavities residing between the shells. The frame may be disposed between the first shell and the second shell, and the shell(s) and/or frame may be coupled together. For example, the frame may be sandwiched between the first shell and the second shell and fasteners may extend through the shells, the frame and a shell, and/or the frame and both shells. A seal between the shells may be created when the fastener(s) exert pressure on the gaskets of the frame and leaks into the cavity of the shell(s) (e.g., where the components reside) may be inhibited. FIG. 1 illustrates an implementation of an example enclosure 100. When the first shell 110 and the second shell 120 are coupled (e.g., via the frame), a cavity 130 may be created between the first and second shell. The frame may be disposed within this cavity. As illustrated, the first shell may include a first flange 113 extending (e.g., at any appropriate angle) from the body of the first shell and a first rim 115 extending (e.g., approximately perpendicular to the first flange, at a slanted angle from the first flange, etc.)

from the first flange. The second shell 120 may include a second flange 123 extending (e.g., at any appropriate angle) from the body of the second shell and a first rim 125 extending (e.g., approximately perpendicular to the second flange, at a slanted angle from the second flange, etc.) from the second flange. The enclosure 100 may be mounted to a location (e.g., seat, wall, fence, handrail, etc.) via mounts. As illustrated, first fixed mounts 140 and/or second movable mounts 150 may couple to the enclosure 100 and/or the location. The movable mounts may tilt or otherwise allow adjustment of a position of the enclosure relative to the location to which the enclosure is being secured by the mount. The movable mount may be lockable to inhibit movement from a set position (e.g., via a lock, via positioning of the enclosure, etc.), in some implementations.

FIG. 2 illustrates an implementation of an example frame 200. The frame 200 may allow components to be secured in the enclosure. For example, components (not shown), such as wireless components, may be coupled to the frame. Components may include any appropriate electrical component(s). For example, the components may include electrical components such as communication components, which may include wireless access point(s), wireless range extender(s), fiber optic communication equipment, wired communication component(s), controllers, converter(s), active antenna(e), passive antenna(e), electronic beacon(s), router(s), connectors (e.g., fiber to copper connectors) and/or any other appropriate component. Components may include electrical components such as sensors and/or power supplies.

The frame 200 may include any appropriate material, such as metal, plastic, fiber reinforced plastic, etc. The frame may be antimony, in some implementations. The frame may provide structure (e.g., to resist bending, crushing, denting, etc.) to the enclosure and/or inhibit damage to components disposed in the enclosure (e.g., by absorbing at least a portion of force applied to the frame, for example, by inadvertent striking or bumping into region of the enclosure in which the frame is disposed), in some implementations. The frame may have any appropriate shape and/or size. The size and/or shape of the frame may be based on the size and/or shape of components to which the frame is designed to coupled and/or fabrication processes.

Figure 2A:
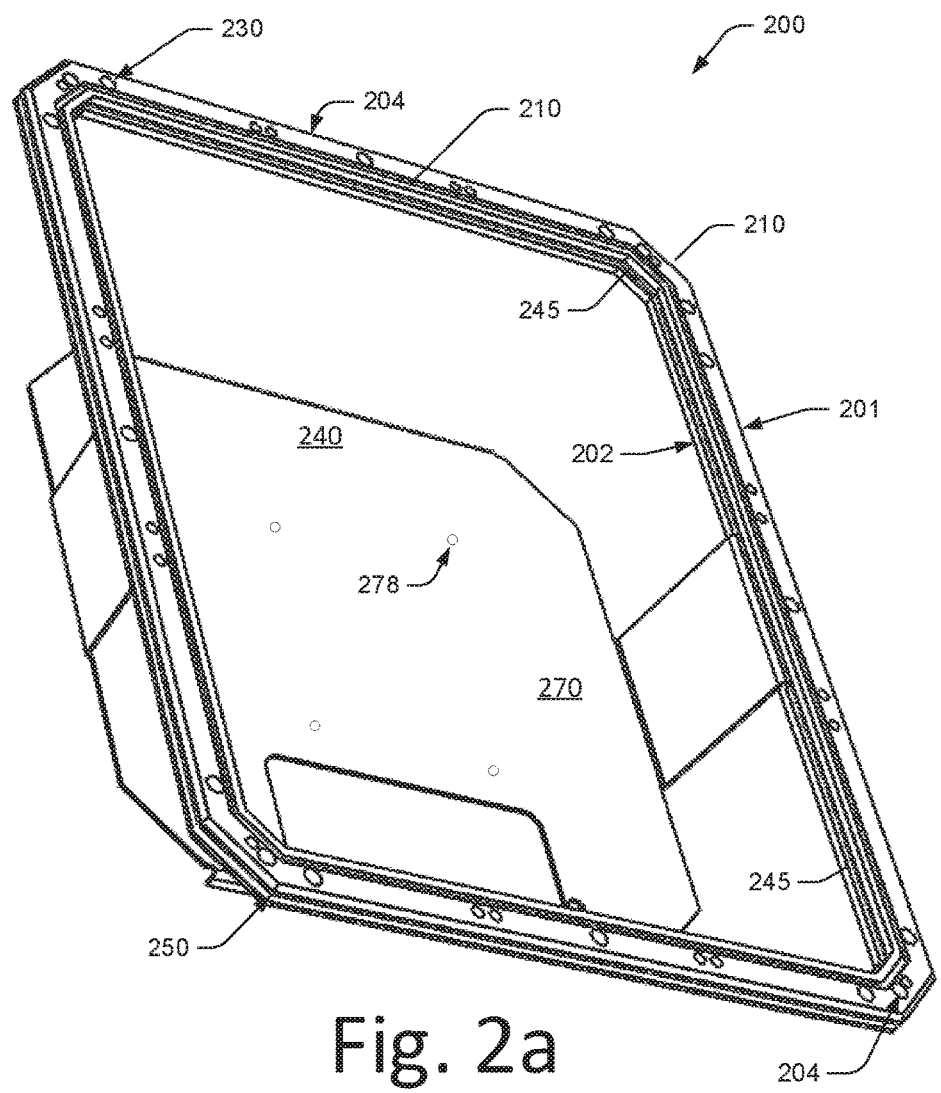
FIG. 2A illustrates an implementation of an example frame and an example component bracket.
Figure 2B:
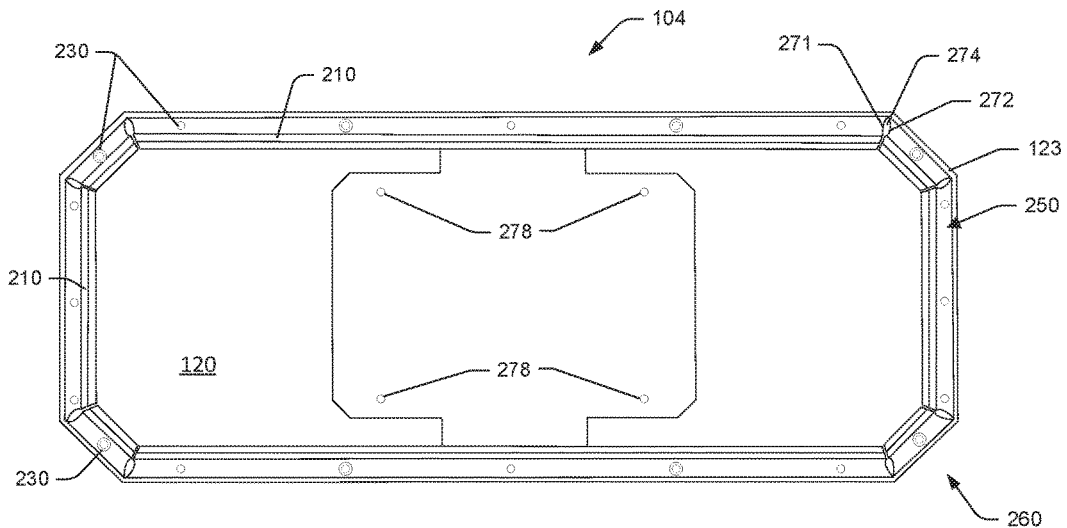
FIG. 2B illustrates an implementation of an example portion of an enclosure that includes a frame with chamfered corners.
Figure 3:
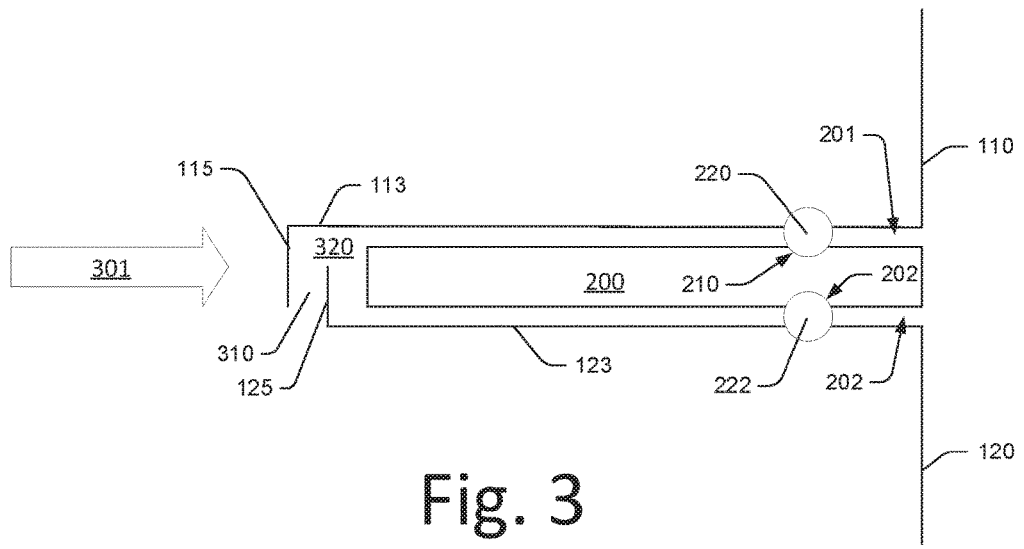
FIG. 3 illustrates cross-sectional view an implementation of portion of an example enclosure.
Figure 5:
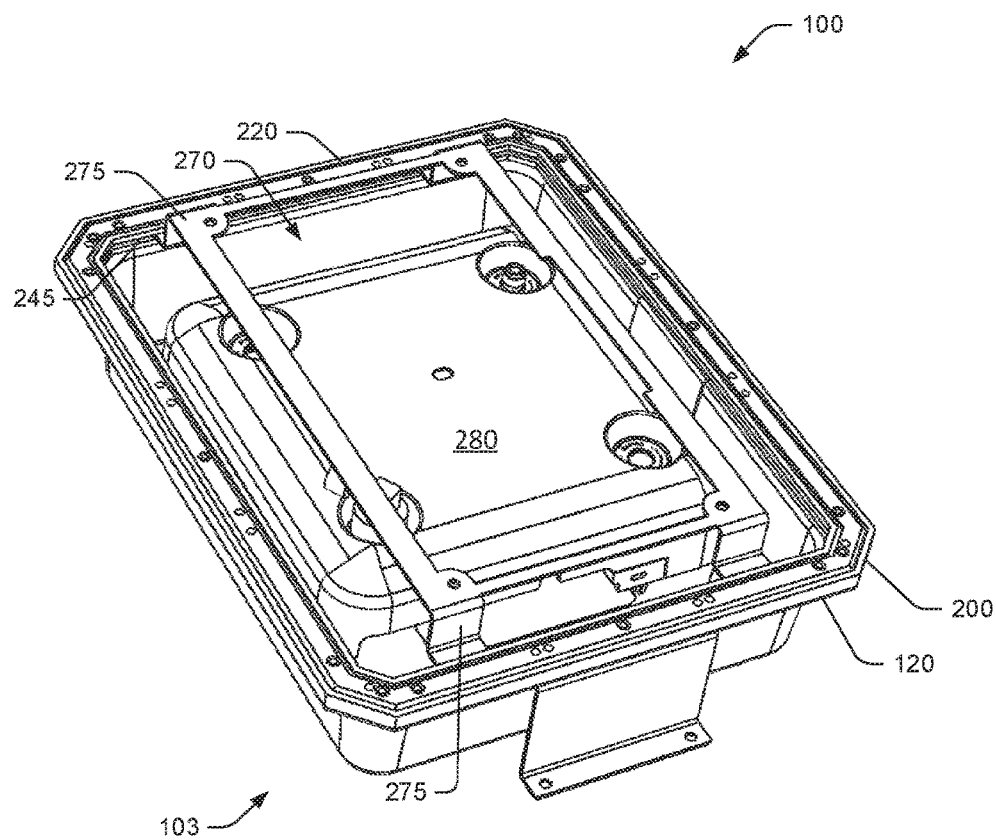
FIG. 5 illustrates an implementation of portion of an example enclosure in which a component bracket is retaining a component.

The frame 200 may be a separate member from the shell(s) and/or other parts of the enclosure. For example, the frame may be a separate part of the enclosure and positioned in at least one of the shells prior to coupling the other parts of the enclosure together. As illustrated in FIGS. 2B, 3, and 5, the frame may be disposed on a flange of the second shell of the enclosure, and the first shell may be disposed on top of the frame and second shell (e.g., with electrical components disposed the cavity of the enclosure). The first shell, frame, and/or second shell may be coupled together to assemble and/or seal the enclosure. Utilizing a separate frame (e.g., as opposed to an integrated frame) may allow the frame to be used in a variety of types of enclosures (e.g., ceiling mounted enclosures, pedestal enclosures, handrail enclosures, etc.). In some implementations, the frame may be integrated into, coupled to, and/or otherwise formed with one or more of the shells.

The frame 200 may have a shape similar to a perimeter of the first shell and/or the second shell. For example, the frame may include a perimeter portion that extends at least partially around a shell of the enclosure when coupled to the shell. The frame may self-align in the appropriate position of the shell (e.g., by the size and/or shape of the frame) and/or the shell may include portions to allow the frame to self-align with the shell(s) (e.g., protrusions and/or recesses that guide the frame into the appropriate position in the shell(s)). The frame may have a shape similar to an annular ring and/or a rectangle with a rectangular shaped opening, in some implementations.

The frame 200 includes a first side, such as top section 201, and a second opposing side, such as bottom section 202. The top section 201 of the frame 200 may include at least one first recess 210 along the perimeter of the frame and/or the bottom section 202 of the frame may include at least one second recess 212 along the perimeter of the frame. The first recess 210 and the second recess 212 may be disposed on opposing sides of the frame. The size and/or shape of the first recess and/or the second recess may be selected based on the type of gasket (e.g., O-ring) that will be utilized to seal the enclosure. The first recess and the second recess may have the same and/or different sizes and shapes. The gaskets used to seal the enclosure may be similar and/or different. The first recess 210 may receive at least a portion of a first gasket 220, and the second recess 212 may receive at least a portion of the second gasket 222, as illustrated in FIG. 3 which illustrates cutaway view of a portion 101 of the enclosure 100 illustrated in FIG. 1. The first gasket and the first recess may be selected such that the first gasket extends beyond the first recess. The second gasket and the second recess may be selected such that the second gasket extends beyond the second recess. Extending the gaskets beyond the recess(es) may facilitate sealing the inner cavity of the enclosure when the frame and gaskets are disposed in the enclosure. The gasket(s) may be compressible. In some implementations, selecting a gasket that extends beyond a recess may allow the gasket to be compressed to provide a seal.

The frame 200 may include inner surfaces 203 and outer surfaces 204. The inner surface(s) 203 may be the surface(s) of the frame that are interior to one or more of the first recesses 210 of the frame and the outer surface(s) 204 may be the surfaces that are exterior to one or more of the first recess of the frame.

The frame 200 may include one or more openings 230. The openings 230 may receive a fastener (e.g., screw, bolt, clip, and/or any other appropriate fastener). The openings 230 may be disposed in one or more outer surfaces 204 of the frame 200. The opening(s) 230 in the frame 200 may be disposed about top section and/or bottom section of the frame. As illustrated in FIG. 2A, the openings 230 may be disposed about the frame 200 at approximately equal distances from each other. In some implementations, openings 230 in the frame 200 may be proximate the corners of the perimeter frame. The openings 230 may be positioned to align with one or more openings in the first shell and/or the second shell (e.g., to allow coupling of the first shell, second shell, and/or frame). Thus, fasteners may be disposed at least partially through the openings in the frame to couple the first shell, the second shell, and/or the frame. In some implementations, the fasteners may exert a force on the first shell, the second shell, and/or the frame to create a seal (e.g., by at least partially compressing the first gasket and/or the second gasket).

In some implementations, the openings and/or fasteners may be disposed on an outer surface of the frame and outside the first gasket (e.g., outside the area sealed by the gasket). The pressure exerted by the fasteners may compress the first shell and the second shell to create a seal using the first gasket. By positioning the openings and thus the fasteners outside the first gasket leaks may be inhibited since the area inside the seal formed by the first gasket may not be penetrated by the fastener(s). For example, sealing washers and/or sealing gaskets may not need to be utilized with the fasteners (e.g., as opposed to when fasteners are disposed inside the area sealed by a first gasket such as an O-ring), in some implementations.

Figure 4:
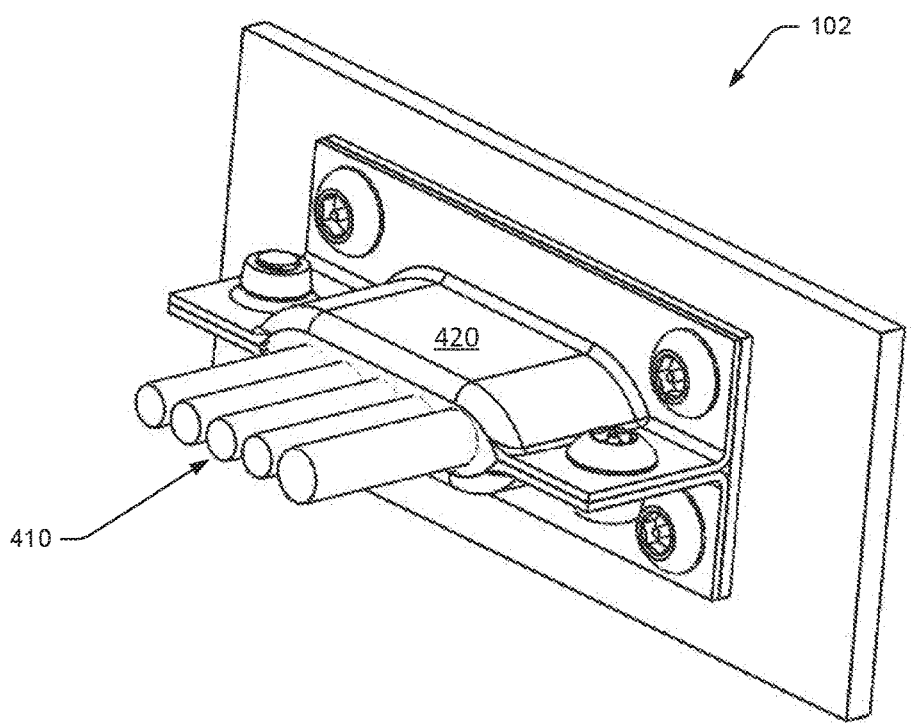
FIG. 4 illustrates an implementation of a portion of an example enclosure.

In some implementations, the frame 200 may include one or more flanges 240 disposed on an outer surface 204 of the frame. In some implementations, cables to and/or from the components may be disposed proximate the flange, which may extend beyond the first shell and the second shell, to allow the cables to extend beyond the enclosure (e.g., to allow coupling to power lines, wired internet lines, etc.). FIG. 4 illustrates a side perspective view of an implementation of a portion 102 of an example enclosure. As illustrated in FIG. 4, the cables 410 may extend through at least a portion of the enclosure. A secondary seal 420 may be provided proximate the flange(s) 240 to inhibit fluids and/or particulates from entering the cavity between the first shell and the second shell (e.g., the region proximate the inner surface of the frame).

The frame 200 may include one or more walls, in some implementations. As illustrated in FIG. 2A, a wall may be disposed on outer surface(s) and/or inner surface(s) of the frame. A wall 240 may extend from one side of the frame to an opposing side of the frame (e.g., top section to the bottom section), in some implementations. The wall may include nuts to facilitate coupling of component(s) to the frame. The wall may include apertures (e.g., slots), protrusions, recesses, and/or other features to facilitate coupling components to the frame. For example, the wall of the frame may include slots 245 that allow direct coupling with a component (e.g., as opposed to and/or in addition to using component manufacturer hardware for coupling). The slot(s) 245 may be a recess in the wall between a top section 201 and a bottom section 202 of the frame. In some implementations, cables associated with components may pass through the apertures in the wall and/or pass proximate the flange of the frame. For example, a power supply cable may pass through aperture(s) in the frame and/or may be disposed proximate the flange of the frame to supply components coupled to the frame with power.

In some implementations, a component may be coupled (e.g., directly and/or indirectly) to the frame via an appropriate fastening system. For example, a component may include one or more openings and first fastener(s) may be utilized to couple the component to apertures in the wall of the frame.

In some implementations, the frame may include groove(s) to couple the component and the frame. A groove may be disposed on inner surface(s) of the frame of the frame. The groove may extend along at least a portion of one or more sides of the inner surface of the frame. For example, the groove may extend along a perimeter of the inner surface of the frame.

Although FIG. 2A illustrates an implementation of an example frame, the frame may include other and/or additional features. For example, the frame may be have a unibody body and/or include segments coupled together. A frame kit may include one or more segments and an implementation of a frame may be created by selecting and coupling two or more of the segments together (e.g., via weld, bonding, couplers, and/or any other appropriate coupling mechanism or member). Thus, a frame may be customized for particular applications. The frame may be a unibody piece, in some implementations, and created by any appropriate process (e.g., bending a length of frame into a desired shape and coupling ends of the frame together, injection molding the frame, casting the frame, and/or combinations thereof). The frame may have any appropriate shape and/or size. The shape of the frame may include one or more corners that are sharp, rounded, and/or chamfered. FIG. 2A illustrates an implementation of a frame 200 with rounded corners. The rounded corners may cause less damage to the shells, installers, wires, etc. (e.g., since the rounded corners may not poke or scratch when as opposed to sharp corners).

Figure 2C:
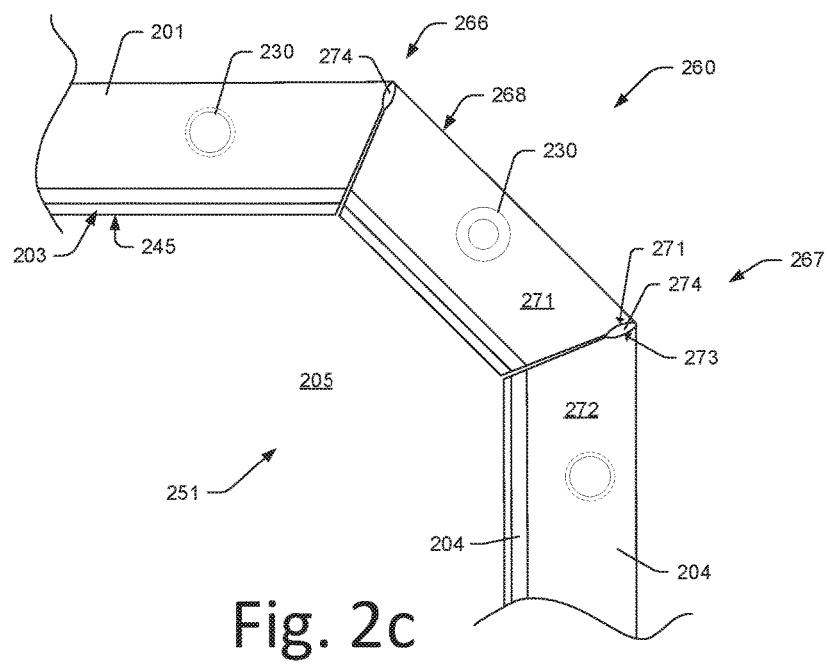
FIG. 2C illustrates a portion of the implementation of the example frame illustrated in FIG. 2B.
Figure 2D:
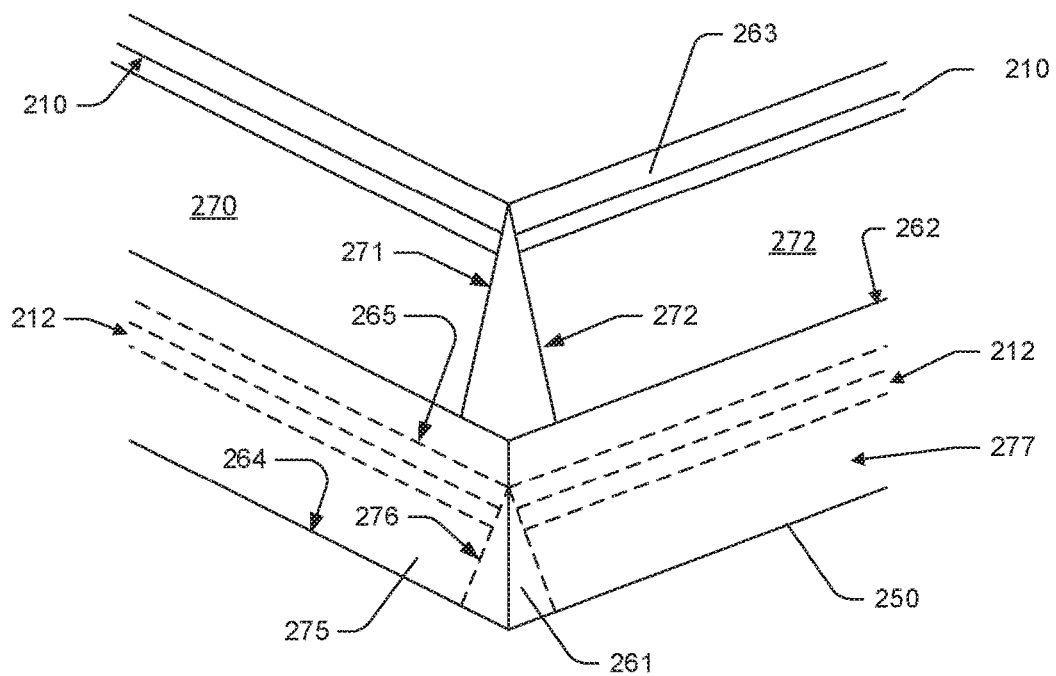
FIG. 2D illustrates a top view of a portion of the example frame illustrated in FIG. 2C.

In some implementations, the frame may include one or more chamfered corners. FIG. 2B illustrates a portion 104 of an implementation of an enclosure that includes an example frame 250 with chamfered corners 255. FIG. 2C illustrates an implementation of a portion 251 of the example frame 250 illustrated in FIG. 2B, and FIG. 2D illustrates a top view of an implementation of a portion 242 of a chamfered corner 255 of the frame 250 illustrated in FIG. 2B. As illustrated in FIG. 2B, the frame 250 may be disposed in a second flange 123 of a second shell 120. The second flange 123 may or may not include retention members (e.g., protrusions, recesses, textures, etc.) to retain the frame (e.g., 250 and/or 200) in the second flange. As illustrated, the frame may be sized and/or shaped, in some implementations, to be self-aligning. The frame 250 may include one or more recesses 210, 212 (e.g., on the top section and/or bottom section) in which gaskets 220, 222 may be partially disposed, openings to receive fasteners (e.g., for coupling to shell(s)), and/or slot(s) to facilitate coupling with component brackets 270.

As illustrated, the frame may include a body with a cavity 205 disposed in the body. For example, the body of the frame may have parts that are coupled to at least partially surround a cavity. Component brackets 270 and/or components 280 may reside in the cavity 205, upon assembly with the enclosure and/or during use. The frame 250 may include one or more pairs of opposing sides, for example the frame may include a top section 201 and a bottom section 202. The frame 200 may include an inner surface 203 and an outer surface 204. The inner surface(s) 203 may extend from recess(es) capable of receiving the gasket(s) (e.g., first recess and/or second recess) towards the cavity. The outer surface 204 may extend from the recess(es) capable of receiving the gasket(s) towards the outer wall.

The frame 250 may include chamfered corners 255. As illustrated, the frame 250 may include an outer wall 251, top section(s) 201, and a bottom section(s) 202. A top section of the frame may include be continuous and/or include more than one portion. A bottom section of the frame may include be continuous and/or include more than one portion. In some implementations, a first end 262 of the top section 201 may be coupled to the outer wall 251 and a second free end 263 of the top section 201 may extend away from the outer wall; and, a first end 264 of the bottom section may be coupled to the outer wall and a second free end 165 of the bottom section may extend away from the outer wall. For example, the frame may be may be a piece of metal that is bend twice to create an outer wall (e.g., with a planar surface, rounded surface, and/or any other appropriately shaped surface) with the top section 201 and the bottom section 202 extending away from the outer wall, as illustrated in FIG. 2D. In some implementations, the top section and/or bottom section may be coupled (e.g., welded, bonded, etc.) to the outer wall.

A chamfered corner of the frame may include one or more corners. As illustrated in FIG. 2C, a chamfered corner 260 may include a first corner 266, a second corner 267, and an angled section 268 disposed between the first and the second corners. In some implementations, a corner (e.g., first corner and/or second corner) of the chamfered corner of the frame may be created by creating a cutaway portion in a top section of the frame (e.g., by cutting, burning, notching, and/or otherwise forming an opening; and/or by forming the top section with the openings) to create a first top section 270 and a second top section 272. The first top section 270 and the second top section 272 may be disposed proximate each other (e.g., the first edge 271 of the first top edge may be proximate the second edge 273 of the second top section 272) and at least partially separated by a gap 274 prior to forming the corner. The first top section and the second top section may then be bent towards the bottom section (e.g., downwards). For example, the free ends 263 of the first 270 and second 272 top sections may be bent such that the free ends of the first and second top sections are disposed more proximate each other (e.g., when compared with when the top sections are aligned perpendicularly with the outer wall). In some implementations, the bend top section (e.g., the first top section and the second top section) may be form a plane approximately perpendicular and/or slanted (e.g., as opposed to parallel with the outer wall) relative to the outer wall. In some implementation, the gap 274 between the free ends of the first and second top sections may be less than and/or approximately equal to the gap between the opposing ends of the first and second top sections (e.g., proximate outer wall). The free ends of the first and second top sections may or may not contact (e.g., the free ends may touch and/or overlap). In some implementations, the free ends of the first and second top sections may not overlap to reduce overall size of the frame. Since the enclosures are generally considered obstructions any reduction in size increases user satisfaction and/or safety (e.g., by reducing the likelihood of inadvertent bumping into the enclosure).

In some implementations, the chamfered corner may include gaps 274 between the first and second top sections. The chamfered corner may include gaps between the segments of first recess disposed in the top section (e.g., first and second top section). The gasket may continue over the gap, in some implementations. In some implementations, the size of this corner gap (e.g., proximate the free ends of the first and section top sections and/or the opposing ends of the first and second top sections) may be minimized to inhibit leaking and/or creation of a seal (e.g., to reduces openings through which leaks may enter). For example, the size and/or shape of the cutaway portion made in the top section may be selected to minimize the gap. For example, the cutaway portion may have a first end proximate the outer wall that is smaller than the second opposing end of the cutaway portion that is proximate the free ends of the top section (e.g., triangular).

In some implementations, a bottom section may include one or more chamfered corners that are similar to the top section chamfered corners. For example, the bottom section may include a first bottom section 275 and a second bottom section 277 created by a cutaway portion. The free ends of the first bottom section and the second bottom section may be bent to create the chamfered corner. For example, the first bottom section 275 and the second bottom section 277 may be disposed proximate each other (e.g., the first edge 276 of the first bottom edge may be proximate the second edge 278 of the second bottom section 277) and at least partially separated by a gap 279 prior to forming the corner. The bottom section may include a recess 212 (e.g., single recess and/or with segments) in which a second gasket 222 may be disposed.

Although the corner of the chamfered corner has been described, similar processes may be utilized to create other corners of implementations of the frame (e.g., sharp corners, rounded corners approximated using a plurality of corners closely spaced together).

The chamfered corner may or may not include openings (e.g., to receive fasteners, such as fasteners that couple the frame to shell(s)). For example, the angled section of the frame may include an opening to receive a fastener (e.g., to couple the frame to at least one of the shells). The openings 230 in the frame (e.g., in the corners and/or not in the corners) may be disposed in the outer surface of the frame. Disposing the fasteners in the outer surface of the frame may inhibit leaking. For example, since an opening in the frame may receive a fastener that extends through at least one of the shells, leaks (e.g., fluids and/or debris) may enter via the opening in the shell through which the fastener is disposed. By positioning this opening in the outer surface of the frame, leaks may stay outside the seal formed by gasket(s) disposed in the recess(es) of the frame and may not contact components within the shells. Thus, damage to the components residing in the cavity of the shells may be inhibited.

One or more slots may be disposed in the frame between the free ends of the top section and the bottom section. The slots may allow the frame and the components to be coupled. For example, a slot may be capable of receiving a portion (e.g., protrusion) of a component bracket and/or component. In some implementations, the frame may include a groove (e.g., on the top section(s) and/or bottom section(s)) capable of receiving a portion of the component bracket and/or component.

In some implementations, the chamfered corners may cause less damage to the shells, installers, wires, etc. (e.g., since the rounded corners may not poke or scratch when as opposed to sharp corners). The chamfered corners of the frame and/or shell may have greater strength than rounded and/or sharp corner frames and/or shells. The chamfered corners may resist bending and/or denting to a greater degree than rounded and/or sharp corners. In some implementations, the chamfered corners may reduce manufacturing costs (e.g., by allowing less expensive shell formation processes such as thermoforming).

In some implementations, the frame may include a component bracket. FIG. 5 illustrates an implementation of portion of an example enclosure in which a component bracket 270 is retaining a component 280 in a portion of cavity 130 of the enclosure 100. The component bracket 270 may include a protrusion 275, which may be received by the slot 245 (e.g., groove) in the wall of the frame. The component bracket may be coupled via fasteners to component(s) and/or may be frictionally coupled by the component bracket to the frame and/or cavity. For example, the component bracket may include one or more apertures 278. A component may be directly coupled to the aperture (e.g., via a protrusion of the component, such as a slot and key locking members) and/or indirectly (e.g., via a fastener disposed through the aperture that couples the component bracket and the component).

In some implementations, one or more slots (e.g., a groove extending between the top section and the bottom section, a groove in an inner wall of the frame, and/or a groove in an inner surface of the frame) may extend along each of two opposing sides of the frame of the enclosure. A component bracket and/or component may include one or more protrusions (e.g., flanges, rims, tongues, etc.) that are received by the groove(s) to couple the component bracket and/or the component to the frame (e.g., a tongue and groove fastening). For example, as illustrated in FIG. 5, the protrusions 275 of the component bracket 270 frictionally fit at least partially in the slots 245 on opposing sides of the frame. In some implementations, the frame may include a slot disposed between the top section and the bottom section of the frame (e.g., a frame with rounded corners, sharp corners, and/or chamfered corners). The slot may be configured to receive and/or retain one or more protrusions of the component bracket and/or component.

Figure 6A:
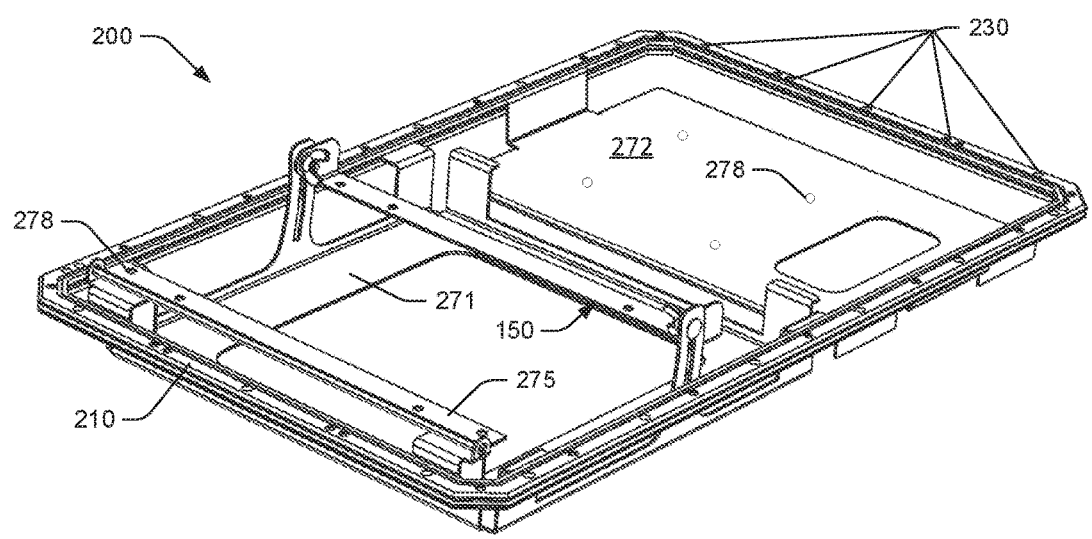
FIG. 6A illustrates an implementation of an example frame.
Figure 6B:
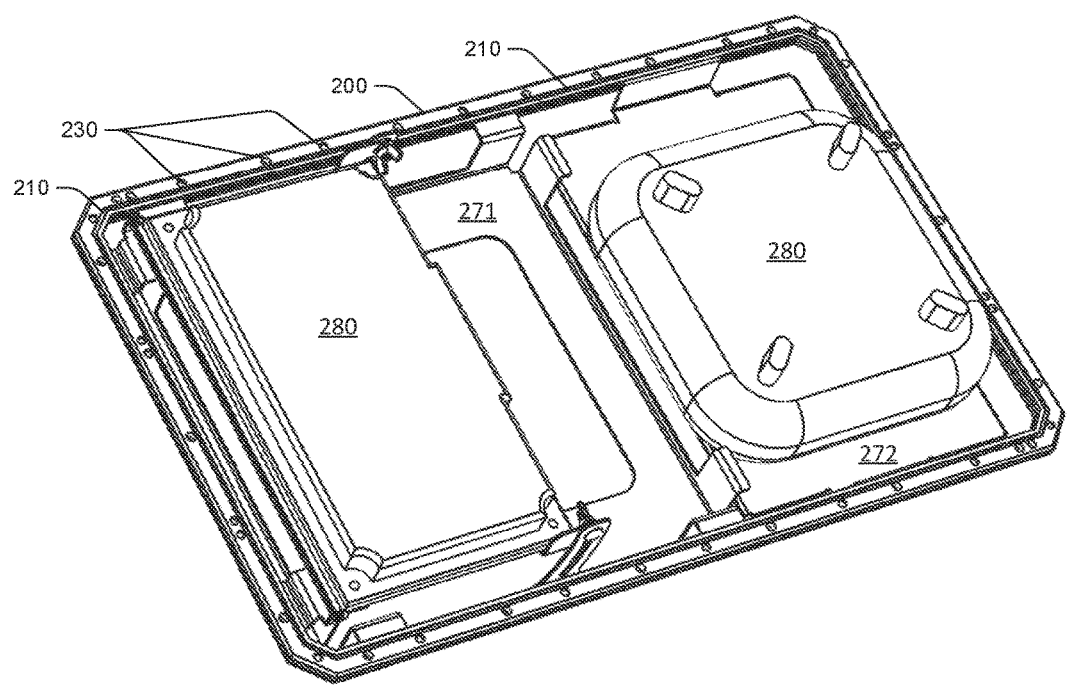
FIG. 6B illustrates an implementation of the example components coupled to the example frame illustrated in FIG. 6A.

For example, a component bracket may include at least two opposing protrusions 275 as illustrated in FIG. 6B. A protrusion may have a thickness to allow deflection of the protrusion and/or include a material that allows the protrusion to be deflected. To couple the component bracket to the frame, the component bracket may be deformed (e.g., protrusions may be deflected, squeezed, etc.) to allow the protrusions to be positioned at least partially in the frame. The component may be at least partially elastically deformable to allow the component frame to return to a first shape after deforming the component bracket to a second shape to allow positioning of the protrusions in the grooves of the frame.

By allowing the component bracket to be coupled to the frame via the protrusions of the component bracket and the groove of the frame, installation costs may be reduced (e.g., when compared with using fasteners to couple the component bracket and the frame), installation may be more quickly accomplished (e.g., since deflecting protrusions to insert into grooves(s) of a frame may be quicker than using fasteners to couple the component bracket and frame), at least portions of the coupling of the enclosure may be toolless, and/or installation may be simplified.

In some implementations, the protrusion(s) of the component bracket and/or component may have a size and shape that allows the protrusion to slide in the groove. For example, if a component bracket includes two protrusions (e.g., tongues) on opposing sides of the component, each of the protrusions may be disposed at least partially in the groove (e.g., on opposing sides of the frame). The protrusion may be coupled to allow the protrusion to move along at least a portion of the groove. For example, a groove of a frame may include straight sections or straight and curved sections. A protrusion may be allowed to move along at least a portion of the straight section of the groove. A protrusion may not be flexible enough to move through a curved section of the groove, in some implementations. Thus, the component may be slidably coupled to the frame (e.g., the component may slide along a length or width of the frame by allowing the protrusion of the component to slide in the groove.) In some implementations, utilizing the groove and protrusion to couple the frame and component(s) may decrease costs (e.g., fewer separate fasteners, less time to install and/or less specialized technician to install), facilitate installation and/or repair (e.g., since tools may not be required to couple a tongue and groove coupling), and/or increase life of the enclosure (e.g., less probability of material fatigue due to over tightening and/or coupling and/or uncoupling).

The frame may be disposed between at least two shells, in some implementations. For example, the frame may be disposed between and coupled to a first and a second shell. As illustrated in FIG. 1, the first shell and the second shell may be coupled together. In some implementations, the shells may be portions of a unibody shell. For example, the unibody shell may include a first shell and a second shell coupled via a hinge (e.g., like a clam shell construction). The frame may reside between the first shell and the second shell. The frame may rest at least partially in the hinge, in some implementations. For example, the frame may be disposed on a second flange of the second shell and on at least a portion of a first end of the hinge, and the first flange and/or the second end of the hinge may be disposed over the frame to couple the first shell and the second shell.

The shells (e.g., first shell and/or the second shell) may include material that is rigid, semi-rigid, and/or flexible. For example, a rigid and/or semi-rigid material may be utilized to provide impact resistance (e.g., when the enclosure is used proximate handrails, in hallways, etc.).

In some implementations, the first shell and/or the second shell may be capable of not substantially deforming when a predetermined amount of force is applied (e.g., a person passing by the enclosure may kick and/or strike the enclosure without substantially deforming the enclosure). For example, when a person or cart bumps into the enclosure the first shell and/or the second shell may not be substantially deformed (e.g., the deformation may not cause damage to the components positioned in the enclosure). The shell may be capable of not substantially deforming in typical traffic for a location in which the enclosure will be installed (e.g., movement of people in ramps and/or hallways).

The first and/or second shell may include waterproof and/or water resistant material (e.g., the shell, a layer of the shell, and/or a coating of the shell may be waterproof and/or water resistant). For example, the first and/or second shell may include a plastic, fiber-reinforced plastic, and/or any other appropriate material. In some implementations, the type of materials included in the first and/or second shell may be based at least partially on the location of the enclosure during use. For example, when the enclosure is used in an outdoor stadium where temperatures fall below 20 degrees Fahrenheit, a material that does not substantially degrade below 20 degrees Fahrenheit may be utilized. As another example, when an enclosure is used in an outdoor location subject to acid rain, the first shell and/or the second shell may include material (e.g., a coating, layer, and/or the shell) that resists damage from acid rain. For example, the shell may include a plastic such as ABS (acrylonitrile butadiene styrene). An enclosure that includes ABS may be at least partially impact resistant and/or allow use in wide range of temperatures (e.g., approximately −5 degrees Fahrenheit to approximately 125 degrees Fahrenheit).

The first shell and/or the second shell may be formed using processes such as thermoforming, injection molding, cast molding, press molding, and/or any other appropriate process. In some implementations, the shells (e.g., first and/or second shell) may have an approximately uniform thickness. The uniform thickness may reduce distortion of communication signals, in some implementations.

The enclosure may be utilized in communication systems, in some implementations. Thus, at least a portion of a shell of the enclosure may allow communication signals to be received and/or transmitted to other devices through the portion of the shell. The first shell, the second shell, or portions thereof may not cause substantial signal loss (e.g., less than 1 dB signal loss in communications from and/or to wireless components in the enclosure). For example, the first and/or second shell may include a material that allows signals (e.g., communication signals, such as wireless, IR, Bluetooth, etc) to at substantially pass through the material. For example, the shell(s) (e.g., the first shell and/or the second shell) may include an RF neutral plastic. Thus, the first and/or second shell may provide protection (e.g., from impact and/or fluid exposure) while not causing substantially signal loss.

The first shell and/or the second shell may include any appropriate shape and/or size. For example, the size and/or the shape of the first shell and/or the second shell may be selected based on the application, the components to be included in the enclosure, the location of the enclosure during use (e.g., handrail, seat, etc.) and/or the type of mounting (e.g., fixed, tilting, etc.). In some implementations, the shell may have a shape similar or dissimilar to the frame. For example, as illustrated in FIG. 5, the shells of the enclosure and the frame may include rounded corners. As illustrated in FIG. 2B, the shells of the enclosure and the frame may include chamfered corners.

The first shell may include a first flange that extends along at least a portion of a perimeter of the first shell. At least a portion of the first flange of the first shell may include a first rim. The first rim may extend at an angle between approximately 1 degree and 179 degrees from the first flange. As illustrated in FIGS. 1 and 3, the first rim may be approximately perpendicular to an axis extending along a length of the first flange.

The second shell may include a second flange that extends along at least a portion of a perimeter of the second shell. At least a portion of the second flange of the second shell may include a second rim. The second rim may extend at an angle between approximately 1 degree and 179 degrees from the second flange. As illustrated in FIGS. 1 and 3, the second rim may be approximately perpendicular to an axis extending along a length of the second flange.

As illustrated in FIGS. 1 and 3, at least a portion of the second shell may have a size and/or shape to be received by at least a portion of the first shell. When the first shell and the second shell are coupled, the second flange of the second shell may be disposed at least partially in an inner cavity of the first flange. For example, a first flange and a first rim of the first shell may overlap the second flange and the second rim of the second shell (e.g., around at least a portion of the perimeter of the enclosure). In some implementations, the second rim and the second flange may be disposed at least partially within the first rim and first flange of the first shell (e.g., the first flange and/or first rim of the first shell may overlap the second flange and second rim of the second shell).

The enclosure may allow the first shell, the second shell and the frame to be coupled and/or uncoupled. The enclosure may allow the second shell to be uncoupled while allowing the frame and the first shell to remain coupled. In some implementations, the enclosure may allow the first shell to be uncoupled while allowing the frame and the second shell to remain coupled. For example, the frame of the frame may include a plurality of openings. The first shell may couple (e.g., via a fastener that couples openings in the first shell) to the frame via a first set of the openings in the frame and may couple with the frame and the second shell via a second set of openings. Thus, if fastener(s) that secure via the first set of openings in the frame are removed, the fastener that secure via the second set will remain in position and the frame and the second shell can remain coupled while uncoupling the first shell. Allowing disassembly and/or partial disassembly may facilitate repairs, replacements, installation and/or removal. For example, to repair a component in the enclosure, a user may remove the first shell and access the component coupled to the frame. In some implementations, the component may be slid (e.g., via tongue and groove coupling) along the groove in the frame of the frame to allow easier access. When a component is slidably coupled to the frame, the component may be slid to a position to allow repair, inspection, maintenance, etc.

In some implementations, the component may slide (e.g., via tongue and groove coupling) along the groove in the frame of the frame to allow components to be field positioned to accommodate different entry points for external cabling. For example, component(s) may be coupled in a first position and then slid into a second position. The second position may allow cables to be connected, may reduce signal loss (e.g., compared to a first position and/or one or more other positions), may allow other components to be coupled to the enclosure, etc. In some implementations, when the entry of cables is not from a pre-defined direction, this feature may allow field selection of the equipment mounting point, which may allow a single enclosure solution for a variety of mounting conditions, reducing installation costs.

The enclosure may be sealed via the coupling between the first shell, the second shell, and the frame. Gaskets may be utilized in the coupling(s) to inhibit exposure of the components coupled to the frame to fluids and/or particulates (e.g., rain, snow, sleet, spills, etc.). As illustrated in FIG. 3, a first gasket may be disposed at least partially in the first groove on the frame of the frame and a second gasket may be disposed at least partially in a second groove on an opposing side of the frame of the frame. When the first shell, the second shell, and the frame are coupled (e.g., via fasteners disposed at least partially through openings in the second shell, frame, and/or first shell), pressure may be exerted on the first and second gasket and the first and the second gasket may create a seal. For example, since the first gasket extends beyond the first recess and the second gasket extends beyond the second recess, when pressure is applied to the first and second gaskets (e.g., by coupling the first shell, second shell, and frame via fasteners), the first gasket and/or the second gasket may deform to create a seal.

The enclosure may be used in a variety of applications. For example, the enclosure may be utilized in stadiums, arenas, pavilions, theaters, buildings, parking lots, and/or any other appropriate structure. The enclosures may be utilized to house components capable of providing a wireless signal to areas proximate the enclosures, in some implementations.

The enclosure may include one or more mounts to couple the enclosure to an area in the location. For example, the enclosure may mount under seats, to hand rails, guard rails, ceilings, walls, structural components of a building, etc. The mounts may be static and/or allow movement of the enclosure. As illustrated in FIG. 1, the enclosure may include first and second mounts. The first mount may be a static mount. The static mount may not allow the position of the enclosure to be substantially changed relative to the item on which the enclosure is coupled. The second mount may be a tilt mount, which allows the position of the enclosure to be changed relative to the item on which the enclosure is mounted. A tilt mount may allow the enclosure to rotate about a hinge. For example, if an enclosure is mounted under a seat that pivots between an up (e.g., to reduce the seat profile) and down (e.g., to allow use of the seat) position, a tilt mount maybe used to couple the enclosure to the seat frame while still allowing the seat position to pivot.

In some implementations, mounts may be replaceable and/or swappable. For example, if an enclosure includes a fixed mount, the fixed mount may be removed and replace with a tilt mount. In some implementations, an enclosure kit may be provided with a plurality of mounts and a user (e.g., an installation technician) may select the mount for an application and couple the mount to the enclosure via fasteners (e.g., screws, quick connect fasteners, etc.).

In some implementations, a sealing clamp may be utilized that allows more than one cable to pass through the enclosure via an opening, as illustrated in FIG. 4. The sealing clamp may inhibit fluids and/or particles from entering the enclosure. Cables of various sizes and/or similar sizes may pass through a sealing clamp, in some implementations. By utilizing a single sealing clamp (e.g., as opposing to providing an opening for each cable to pass), costs may be reduced (e.g., since fewer openings are sealed), less fluid and/or particle may pass through (e.g., more openings create more opportunities for leakage), and/or reduce installation errors, in some implementations. In some implementations, utilizing a sealing clamp may allow an enclosure design to be used with more than application (e.g., increasing flexibility). For example, the sealing clamp may allow the number of cables to be varied based on a specific use unlike with conventional cable grommets, in which a new opening and new grommet (e.g., seal) must be used for each cable. For example, in a location, first enclosures may include component(s) that utilize 2 cables extending from the enclosure and second enclosures may include component(s) that utilize 5 cables extending from the enclosure. The same enclosure may be utilized with the first enclosure and the second enclosures since the sealing clamp may be large enough to accommodate multiple cables (e.g., 1-6, 2-10, and/or any other appropriate number). In some implementations, installation labor costs may be reduced (e.g., since a single enclosure design may accommodate more than one type of application by using a sealing clamp) and/or installation may be simplified when using a sealing clamp (e.g., when compared to a single cable grommet type cable seal in which new openings are drilled for each cable and each cable is sealed independently).

In some implementations, by utilizing a single sealing clamp (e.g., as opposing to providing an opening for each cable to pass), the total footprint of all cable penetrations may be reduced, allowing for more than one cable to be integrated into the enclosure in a space efficient manner. In some implementations, cable entry may be allowed from a single direction and there may be limited exposed enclosure surface to accommodate cable entry. Without a multi-cable sealing cable some enclosure installations may not be possible.

In some implementations, the enclosure may include a mechanical obstruction that inhibits fluids and/or debris from entering the inner cavity of the enclosure. For example, the enclosure may include a clamp that covers proximate ends of the first shell and the second shell. The clamp may cover then ends of the first shell and the second shell to inhibit fluid and/or debris from directly contacting the ends of the shells (e.g., to inhibit contact between the fluid and debris and the gasket(s) and/or inner cavity of the enclosure). The clamp may be formed of a material similar to the shell(s), a flexible material, and/or any other appropriate material. The clamp may couple directly and/or indirectly with at least a portion of the first shell and/or the second shell. For example, the clamp may include two arms that can be deflected to allow positioning the clamp over end(s) of the shell(s). The clamp may include fasteners that fastener arms of the clamp to the shell(s).

In some implementations, the mechanical obstruction may include an enclosure in which the first flange of the first shell and the second flange of the second shell may overlap. For example, the first rim of the first flange and the second rim of the second flange may at least partially overlap. As illustrated in FIG. 3, a gap 310 may exist between the first rim 115 of the first shell 110 and the second rim 125 of the second shell 120. The overlap (e.g., of the rims 115, 125) may at least partially block fluids and/or particles from entering the inner cavity 320 (e.g., between the first shell and second shell and at least partially surrounded by the first gasket and/or second gasket) and inhibit exposing the components in the enclosure to fluids and/or particles. In some implementations, the overlap may prevent failure of the gasket and/or reduce wear on the gaskets of the enclosure (e.g., by inhibiting fluids, for example, from high pressure water streams and/or spills, from contacting the gasket). For example, when the enclosure is exposed to high pressure water streams 301 (e.g., during location cleanings), the gasket may prematurely wear or fail. Thus, the overlap may protect the gasket from the direct pressure of a high pressure water stream. In addition, the gasket may prematurely wear or fail under prolonged exposure to light (e.g., UV), and the shell(s) may inhibit premature wear and/or failure by inhibiting gasket exposure direct exposure to light.

In some implementations, the enclosure may have a mechanical obstruction (e.g., overlapping shells) and gasket(s) to provide a seal for the enclosure. Allowing the enclosure to have a mechanical obstruction (e.g., overlapping shells, rim(s), and/or clamp) and gasket(s) may allow the enclosure to inhibit fluid entry from high pressure sprays. For example, high pressure sprays are commonly used in cleaning (e.g., stairs, seats, floors, etc.). To allow the enclosure to remain coupled to a location during cleaning, an enclosure with a mechanical obstruction and gasket(s) may be selected to inhibit damage from high pressure sprays (e.g., withstand force of high pressure water and/or cleaning solution spray, inhibit fluid entry into inner cavity, inhibit fluid contact with components in enclosure, etc.).

In some implementations, component brackets may be layered to allow multiple components to be installed in a single enclosure. For example, using a separate antenna bracket, the enclosure can easily accommodate an access point with an antenna above the access point. For example, as illustrated in FIG. 5, more than one component bracket may be coupled to the frame of the enclosure. A component may be supported by and/or coupled to a first component bracket 271 below a component. A second component bracket 272 may be used to provide protection to the component (e.g., if the enclosure is impacted, the component bracket may receive at least a portion of the force from the impact rather than the component), as illustrated in FIG. 5. In some implementations, additional component(s) may be coupled to the enclosure via the second component bracket. FIG. 6A illustrates an implementation of an example frame of an enclosure in which multiple component brackets 271, 272g are disposed. FIG. 6B illustrates components 280 coupled to the component brackets 271, 272 in the example frame illustrated in FIG. 6A. As illustrated, the frame includes a first recess and a second recess (not shown) into which gaskets, such as an O-ring, can be disposed. The frame includes a groove that extends about a perimeter of the frame. The protrusion(s) of component brackets may be inserted at least partially into the groove of the frame to couple the component brackets to the groove. The frame may include more than one component brackets, to which component(s) may be coupled. The component brackets may be disposed in the frame to reside at approximately the same plane or a different plane as another component bracket. For example, as illustrated component bracket #1 271 is disposed below (e.g., a bottom portion of the component bracket) component bracket #2 272. In some implementations a component bracket #3 (not shown) may be coupled to the frame and component bracket #2 and component bracket #3 may be disposed on approximately the same plane. In some implementations, one or more of the component brackets may be slidably coupled to the groove using the protrusions. Thus, to access a component such as a component on component bracket #1, component bracket #2 and/or other component brackets, such as component bracket #3 (not shown), may be slid (e.g., away from a portion of the component bracket #1).

EXAMPLES

Example 1

The enclosures may be provided may include one or more of the following features.

The shell(s) (e.g., first shell and/or second shell) may be thermo-formed shells that are formed at least partially from ABS plastic. The thermo-forming may offer affordable molding costs and may cost effectively accommodate small production runs (100 units or less) and larger production runs. Thus, the enclosure size and/or shape may be selected based on the application. The Thermo-formed shells may provide durability, performance over a range of temperatures, UV stability, etc. The shell may be an RF neutral plastic. The shells may be inter-locking plastic shells.

The seal in the enclosure (e.g., between the coupled first shell, second shell, and/or frame) may inhibit exposure of the components in the enclosure to fluid and/or particle(s). For example, in many public venue/stadium environments, the enclosures are not only exposed to rain and standing water but high pressure water from equipment that is used to clean the venue. IP68 rated equipment, for example, which is rated to withstand extended submersion in water fail when exposed to high pressure water streams resulting in equipment failure and potentially fire hazard. Thus, the seal of the enclosure (e.g., the coupling of the first shell, second shell, frame, and gaskets) may inhibit leaks (e.g., exposure of components in the enclosure) when exposed to high pressure water streams.

Example 2

The enclosure may be modular. For example, the enclosure may include interchangeable mounting feet. RF designer's may look to install RF systems and in particular antennae look to specific angles to achieve their coverage objectives. When antennae are incorporated into the enclosure system for stealthing purposes or to protect the antenna(s) from environmental conditions, the designer typically accepts a performance compromise. By separating the mounting system and the enclosure, enclosure may accommodate different mounting requirements without requiring structural changes to the enclosure. By attaching the mounting systems to the sealing ring, structural needs are accommodated. Mounting options include feet that provide fixed orientation, feet that allow the entire box (and therefore integrated antennae) to be tilted, and feet that offset the box from the mounting surface to accommodate structural conflicts on the mounting surface (for example existing conduit).

Modularity—The system may allow the assembly of an enclosure from a family of interchangeable parts. For example a single sealing ring design can accommodate multiple mounting plate configurations and the depth of an enclosure can be adjusted by changing the depth of one or both shells. The system can also employ different mounting feet to create low profile, offset, and/or tilting versions of the same enclosure variant. Modularity and a shared component system may be cost effective at low volumes and/or allow customization to specific venue and technology solution. The modularity may allow low cost customization of enclosures for applications.

Example 3

The enclosures may be design to accommodate a plurality of different components. Thus, a set of similar enclosure may be deployed to a locations and each enclosure may include different or similar components.

Example 4

In some implementations, the enclosure may allow components to be coupled to the frame with few or no tools. Generic versions of the mounting system provide for common mounting systems, but custom needs can be easily accommodated by developing cost effective alternative brackets. Brackets can also be layered when multiple components need to be installed in a single enclosure. For example, using a separate antenna bracket, the enclosure can easily accommodate an access point with an antenna above the access point.

End of Examples

In some implementations, the described systems and process and/or portions thereof may be utilized with different types of enclosures, such as ceiling enclosures, handrail enclosures, pedestal enclosures, etc. For example, U.S. Provisional Patent Application No. 62/354,569, filed Jun. 24, 2016, which is incorporated to the extent that it does not conflict with the described systems and process, describes a mounted enclosure. The described frames or portions thereof may be used in the mounted enclosures of U.S. Provisional Patent Application No. 62/354,569, in some implementations. As another example, U.S. patent application Ser. No. 14/581,955, filed on Dec. 23, 2014 describes a handrail enclosure (e.g., in which the enclosure is mounted onto a handrail, such as on stairs in an outdoor venue). The described frames or portions thereof may be used in the handrail enclosure described in U.S. patent application Ser. No. 14/581,955, in some implementations.

Described systems may include one or more of the described features. However various features may be added, deleted, and/or modified, as appropriate. Described processes may be implemented by various described systems. In addition, various operations may be added, deleted, and/or modified, as appropriate. In some implementations, processes may be performed in combination with other processes, as appropriate.

In various implementations, seals have been described. The seal may inhibit fluid and/or particulate from entering the seal via the sealed area.

Although shells have been described as including a first shell and a second shell, implementations may include one or more shells. For example, a shell may include two portions (e.g., a first shell and a second shell) that wrap at least partially around the frame. In some implementations, a second shell may include two or more parts that are separately removable. Thus, partial access to the cavity between the first shell and the second shell may be obtained by removing at least one of the parts of the second shell.

Although portions of the enclosure have been described in terms of direction, such as top and/or bottom, the directional terms are intended to convey relative position to each other rather than orientation of the enclosure itself. For example, a top section of the frame may face the second shell rather than the first shell, may be oriented towards a wall when disposed in an enclosure, and/or oriented towards the ground when disposed in an enclosure.

Although users have been described as a human, a user may be a person, a group of people, a person or persons interacting with one or more computers, and/or a computer system.

It is to be understood the implementations are not limited to particular systems or processes described which may, of course, vary. It is also to be understood that the terminology used herein is for the purpose of describing particular implementations only, and is not intended to be limiting. As used in this specification, the singular forms "a", "an" and "the" include plural referents unless the content clearly indicates otherwise. Thus, for example, reference to "a groove" includes a combination of two or more grooves and reference to "a component" includes different types and/or combinations of components. Additionally, coupling may refer to direct coupling and/or indirect coupling, as appropriate.

Although the present disclosure has been described in detail, it should be understood that various changes, substitutions and alterations may be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The invention claimed is:

1. An enclosure for housing electronic components, the enclosure comprising:
   a frame comprising a frame body, wherein the body comprises:
     an outer wall;
     a top section, wherein the top section comprises a first recess to receive a first gasket;
     a bottom section, wherein the bottom section comprises a second recess to receive a second gasket;
     one or more inner surfaces disposed between the first recess and an edge of the top section and between the second recess and an edge of the bottom section;
     one or more opposing outer surfaces disposed between the first recess and the outer wall and between the second recess and the outer wall; and
     one or more openings disposed in at least one of the outer surfaces and through the top section and the bottom section, and wherein each opening is capable of receiving a fastener to couple the frame to an enclosure capable of housing electrical components;
   the first gasket being at least partially disposed in the first recess of the frame body;
   the second gasket being at least partially disposed in the second recess of the frame body;
   a first shell, wherein the first shell comprises:
     a first body comprising a first cavity;
     a first flange extending from the first body of the first shell; and
     a first rim coupled to the first flange; and
   a second shell, wherein the second shell comprises:
     a second body comprising a second cavity;
     a second flange extending from the second body of the second shell, wherein the second flange is configured to receive the frame and
     a second rim couple to the second flange, wherein the first rim of the first shell is configured to overlap the second rim of the second shell when the first shell and the second shell are coupled;
   wherein the enclosure is configured to be at least partially sealed by first contact between the first gasket and the frame and between the first gasket and the first flange of the first shell, and wherein the enclosure is configured to be at least partially sealed by second contact between the second gasket and the frame and between the second gasket and the second flange of the second shell.

2. The enclosure of claim 1 wherein the first shell and the second shell e portions of a one-piece shell that are joined by a hinge.

3. The enclosure of claim 1 wherein the first shell and the second shell comprise one or more aligned shell openings to couple the first shell and the second shell, and wherein one or more of the aligned shell openings are disposed such that at least one fastener may be disposed through at least one shell aligned opening and at least one opening in the frame, and wherein the first gasket is compressible, and wherein the second gasket is compressible, and wherein when assembled, the first gasket and the second gasket are at least partially compressed by at least one of the fasteners disposed in at least one of the aligned shell openings.

4. The enclosure of claim 1 further comprising one or more component brackets configured to couple with one or more electronic components and the frame.

5. The enclosure of claim 1 wherein the frame body further comprises one or more slots disposed between the top section and the bottom section that receive a component bracket, wherein at least one slot is disposed along at least part of the first side of the body, and wherein at least one slot is disposed along at least part of a second side of the body; and
   wherein the enclosure further comprises one or more component brackets configured to receive one or more electronic components, wherein each component bracket comprises a first protrusion and a second protrusion; wherein the first protrusion configured to be disposed in at least one of the slots disposed along a part of the first side of the body and the second protrusion is configured to be disposed in at least one of the slots disposed along a part of the second side of the body to couple the component bracket to the body.

6. The enclosure of claim 1 further comprising one or more mounts to couple the enclosure to a location, wherein a first end of one or more of the mounts couples to at least one of the first shell or the second shell, and wherein a second end of one or more of the mounts is capable of coupling to the location.

7. The enclosure of claim 1 wherein the frame further comprises one or more chamfered corners, wherein each chamfered corner comprises:
   at least two corners; and wherein each corner is a bend in the outer wall, and wherein a portion of the top section is removed such that the bend disposes a free edge of a first edge of the top section proximate to a free edge of the second edge of the top section in each of the corners, and wherein a portion of the bottom section is removed such that the bend disposes a free edge of a first edge of the bottom section proximate to a free edge of the second edge of the bottom section in each of the corners; and an angled section disposed between at least two of the corners.

8. The enclosure of claim 1 wherein the enclosure is configured to be water resistant upon assembly.

9. The enclosure of claim 8 wherein the enclosure further comprises a sealing clamp, wherein the dealing clamp allows cabling to extend from exterior to the enclosure and into the first cavity of the first shell and the second cavity of the second shell.

10. A frame comprising:
a body, wherein the body comprises:
  a first side;
  a second opposing side;
  an outer wall;
a top section, wherein the top section comprises a first recess that receives a first gasket;
a bottom section, wherein the bottom section comprises a second recess that receives a second gasket;
one or more inner surfaces disposed between the first recess and an edge of the top section and between the second recess and an edge of the bottom section;
one or more opposing outer surfaces disposed between the first recess and the outer wall and between the second recess and the outer wall;
one or more openings disposed in at least one of the outer surfaces and through the top section and the bottom section, and wherein each opening is capable of receiving a fastener to couple the frame to at least part of an enclosure capable of housing electrical components;
one or more slots disposed between the top section and the bottom section and capable of receiving a component bracket, wherein at least one slot is disposed along at least part of the first side of the body, and wherein at least one slot is disposed along at least part of a second side of the body; and
one or more component brackets configured to couple with one or more electronic components, wherein each component bracket comprises at least one first protrusion and at least one second protrusion; wherein at least one of the first protrusions is configured to be disposed in at least one of the slots disposed along a part of the first side of the body and at least one of the second protrusions is configured to be disposed in at least one of the slots disposed along a part of the second side of the body to couple the component bracket to the body.

11. The frame of claim 10 further comprising the first gasket partially disposed in the first recess of the body; and the second gasket partially disposed in the second recess of the body, wherein the frame is capable of creating a seal between a first portion of a housing of the enclosure and a second portion of a housing of the enclosure by allowing at least a part of the first portion of the housing to contact the first gasket and by allowing at least a part of the of the second portion of the housing to contact the second gasket.

12. The frame of claim 10 wherein the body comprises a third side and an opposing fourth side, and wherein the frame further comprises one or more additional component brackets configured to couple with electronic components, wherein each additional component bracket comprises at least one third protrusion and at least one fourth protrusion; wherein at least one of the third protrusions is configured to be disposed in at least one of the slots disposed along a part of the third side of the body and at least one of the fourth protrusions is configured to be disposed in at least one of the slots disposed along a part of the fourth side of the body to couple the additional component bracket to the body.

13. The frame of claim 10 wherein at least one of the component brackets is slidably coupled to the body such that a position of the at least one component bracket is alterable.

14. The frame of claim 10 wherein the body further comprises a flange extending from the body of the frame; wherein the flange is configured to extend beyond a housing of an enclosure, in which the frame is disposed, to allow cabling to extend from a cavity of the frame to beyond the enclosure.

15. A frame, comprising:
a body, wherein the body comprises:
  a first side;
  a second side that opposes the first side;
  an outer wall disposed proximate an outer surface of the frame;
  a top section, wherein the top section comprises:
    a first recess to receive a first gasket;
  a bottom section, wherein the bottom section comprises:
    a second recess to receive a second gasket;
  one or more chamfered corners, wherein each chamfered corner comprises:
    at least two corners; and wherein each corner is a bend in the outer wall, and wherein a portion of the top section is removed such that the bend disposes a free edge of a first edge of the top section proximate to a free edge of the second edge of the top section in each of the corners, and wherein a portion of the bottom section is removed such that the bend disposes a free edge of a first edge of the bottom section proximate to a fee edge of the second end of the bottom section in each of the corners; and
    an angled section disposed between at least two of the corners;
  the first gasket being partially disposed in the first recess of the body; and
  the second gasket being partially disposed in the second recess of the body.

16. The frame of claim 15 wherein the body of the frame comprises a one-piece body.

17. The frame of claim 15 further comprising:
one or more inner surfaces disposed between the first recess and an edge of the top section and between the second recess and an edge of the bottom section;
one or more opposing outer surfaces disposed between the first recess and the outer wall and between the second recess and the outer wall;
one or more openings disposed in at least one of the outer surfaces and through the top section and the bottom section, and wherein each opening receives a fastener to couple the frame to an enclosure capable of housing electrical components;
one or more slots disposed between the top section and the bottom section to receive a component bracket; one or more wherein at least one slot is disposed along at least part of the first side of the body, and wherein at least one slot is disposed along at least part of a second side of the body.

18. The frame of claim 17 further comprising one or more component brackets configured to couple with one or more electronic components, wherein each component bracket comprises a first protrusion and a second protrusion; wherein the first protrusion is configured to be disposed in at least one of the slots disposed along a part of the first side of the body and the second protrusion is configured to be disposed in at least one of the slots disposed along a part of the second side of the body to slidably couple the component bracket to the body.

19. The frame of claim 17 further comprising a flange extending from the body of the frame; and wherein the flange is configured to extend beyond a housing of an enclosure, in which the frame is disposed, to allow cabling to extend from a cavity of the frame to beyond the enclosure.

20. The frame of claim 17 wherein the first recess and the second recess extend along at least a portion of the length of the perimeter of the body of the frame.

* * * * *